(12) United States Patent
Ngo et al.

(10) Patent No.: US 6,368,948 B1
(45) Date of Patent: Apr. 9, 2002

(54) METHOD OF FORMING CAPPED COPPER INTERCONNECTS WITH REDUCED HILLOCKS

(75) Inventors: Minh Van Ngo, Fremont, CA (US); Hartmut Ruelke; Joerg Hohage, both of Dresden (DE); Lothar Mergili, Radebeul (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/626,454

(22) Filed: Jul. 26, 2000

(51) Int. Cl.[7] ............................................... H01L 21/20
(52) U.S. Cl. ..................... 438/584; 438/585; 438/586
(58) Field of Search ................................. 438/584, 585, 438/586, 597, 618

(56) References Cited

U.S. PATENT DOCUMENTS 4,704,367 A * 11/1987 Alvis et al.

\* cited by examiner

Primary Examiner—Kevin M. Picardat

(57) ABSTRACT

Reliably capped Cu interconnects are formed with a significant reduction in the amount and size of hillocks by reducing the time during which the Cu interconnect is exposed to elevated temperatures for plasma surface treatment and capping layer deposition. Embodiments of the present invention include maintaining a continuous plasma during surface treatment to remove copper oxide and capping layer deposition, and exposing the wafer to elevated temperatures to no greater than 60 seconds in the reaction chamber.

17 Claims, 3 Drawing Sheets

METHOD OF FORMING CAPPED COPPER INTERCONNECTS WITH REDUCED HILLOCKS

TECHNICAL FIELD

The present invention relates to copper (Cu) and/or Cu alloy metallization in semiconductor devices, particularly to capped Cu or Cu alloy interconnects with reduced hillocks. The present invention is applicable to manufacturing high-speed integrated circuits having submicron design features, and high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance-capacitance) interconnect pattern, particularly wherein submicron vias, contacts and trenches have high aspect ratios imposed by miniaturization.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RC delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.18 micron and below, e.g., about 0.15 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP, as in Teong, U.S. Pat. No. 5,693,563. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer, such as TaN, lining the opening and on the surface of the interlayer dielectric, filling the opening with Cu or a Cu alloy layer, conducting CMP, and forming a barrier or capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to removal, as by peeling due to stresses resulting from subsequent deposition of layers. As a result, the Cu or Cu alloy is not entirely encapsulated and Cu diffusion occurs, thereby adversely affecting device performance and decreasing the electromigration resistance of the Cu or Cu alloy interconnect member.

In copending application Ser. No. 09/626,455 filed on Jun. 26, 2000 a method is disclosed for reliably capping a Cu or Cu alloy member with a silicon nitride barrier layer, the method comprising treating an exposed Cu or Cu alloy surface under plasma conditions. The disclosed method provides excellent adhesion of the silicon nitride barrier layer to the Cu or Cu alloy surface while preventing corrosion and/or poisoning at the interface between the Cu or Cu alloy interconnect and the capping layer.

However, upon further experimentation and investigation, it was observed that capped Cu or Cu alloy interconnects exhibited a large amount of sizable Cu hillocks which resulted in unacceptable reliability and a high rejection rate. The presence of such Cu hillocks reduces the integrity of the capping layer thereby exposing Cu and also causes shorting between Cu lines.

Therefore, the adhesion of capping or barrier layers to Cu interconnects and the accuracy of interconnects for vertical metallization levels require even greater reliability. Accordingly, there exists a need for methodology enabling the formation of encapsulated Cu and Cu alloy interconnect members for vertical metallization levels with greater accuracy and reliability. There exists a particular need for methodology enabling the formation of a capping layer on a Cu or Cu alloy interconnect with strong adhesion therebetween with an attendant reduction in the size and amount of hillocks.

DISCLOSURE OF THE INVENTION

An advantage of the present invention is a method of manufacturing a semiconductor device having highly reliable Cu or Cu alloy interconnect members.

Another advantage of the present invention is a method of manufacturing a semiconductor device comprising a Cu or Cu alloy interconnect member having a silicon nitride capping layer tightly adhered thereto with an attendant reduction in the size and amount of Cu hillocks.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: treating a surface of a Cu or Cu alloy in a reaction chamber with a plasma containing ammonia and nitrogen; introducing silane into the reaction chamber while maintaining the plasma to deposit a silicon nitride barrier layer on the treated surface of the Cu or Cu alloy in the plasma containing ammonia, nitrogen and silane, with no interruption of the plasma between treating the exposed surface and depositing the silicon nitride barrier layer.

Another aspect of the present invention is a method of manufacturing a semiconductor device, the method comprising: introducing a wafer into a reaction chamber maintained at an elevated temperature, the wafer containing an exposed surface of Cu or a Cu alloy; treating the exposed surface of the Cu or Cu alloy in a plasma containing ammonia and nitrogen; and introducing silane into the reaction chamber while maintaining the plasma to deposit a silicon nitride barrier layer with no interruption of the plasma between treating the exposed surface and depositing the silicon nitride barrier layer.

Embodiments of the present invention comprise exposing the wafer to an elevated temperature, such as about 300° C. to about 420° C., in the reaction chamber for a period of time no longer than about 60 seconds, e.g., no longer than about 52 seconds. Embodiments of the present invention further include treating the exposed surface of the Cu or Cu alloy in a plasma containing ammonia and nitrogen for a period of time of about 5 seconds to about 15 seconds and depositing the silicon nitride barrier layer on the treated Cu or Cu alloy surface for a period of time of about 10 seconds to about 30 seconds.

Embodiments of the present invention further include forming an opening in an interlayer dielectric on a wafer, depositing an underlying diffusion barrier layer, such as TaN, lining the opening and on the interdielectric layer, depositing the Cu or a Cu alloy layer on the diffusion barrier layer filling the opening and over the interlayer dielectric, removing any portion of the Cu or Cu alloy layer beyond the opening by CMP, leaving an exposed surface oxidized, and conveying the wafer into the reaction chamber for processing in accordance with the present invention. In the reaction chamber, the plasma is generated and maintained continuously during surface treatment to remove copper oxide and silicon nitride barrier layer deposition. The wafer is in the reaction chamber and exposed to elevated temperatures for no longer than 60 seconds.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
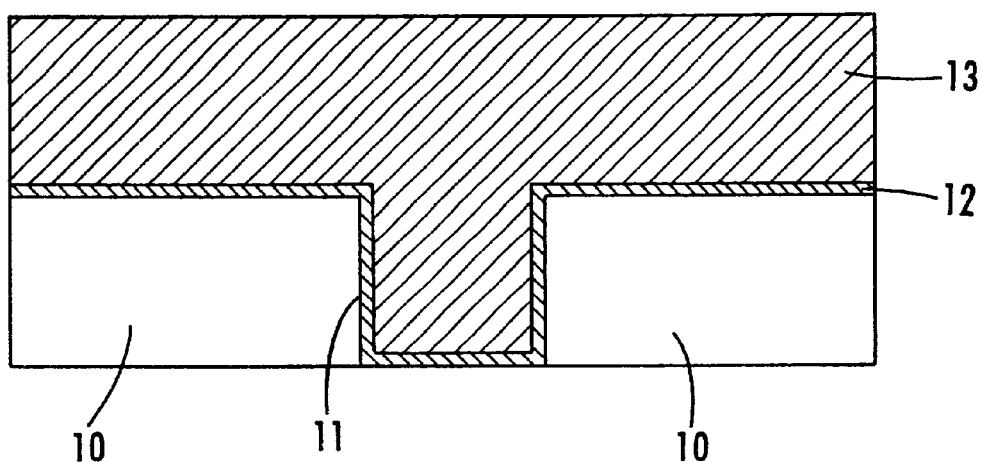
FIGS. 1–4 schematically illustrate sequential phases of a method in accordance with an embodiment of the present invention.

The present invention addresses and solves problems attendant upon forming a capped Cu or Cu alloy interconnect, as with a silicon nitride barrier or capping layer. Methodology in accordance with embodiments of the present invention enables a significant reduction in the amount and size of hillocks formed, as during treatment of the Cu or Cu alloy surface to remove copper oxide and deposition of the capping layer, thereby preventing penetration of the capping layer and short circuiting between Cu or Cu alloy lines. Embodiments of the present invention also improve adhesion of the capping layer, thereby preventing capping layer peeling, preventing copper diffusion and enhancing electromigration resistance. As employed throughout this application, the symbol Cu is intended to encompass high purity elemental copper as well as Cu-based alloys, such as Cu alloys containing minor amounts of tin, zinc, maganese, titanium, magnesium and germanium.

As design rules are scaled down into the deep submicron range, such as about 0.15 micron and under, the reliability of encapsulated Cu interconnect members becomes increasingly significant. Upon conducting experimentation and investigation, it was found that capped Cu interconnects exhibited an unacceptable large amount of hillocks having an unacceptable large size. Such hillocks penetrate into the overlying capping layer and penetrate into neighboring Cu lines causing short shorting therebetween. Hillocks are spike-like projections that protrude from the Cu interconnect surface which can result from stresses caused by heat during processing. Prior methodology comprises treating an exposed surface of a Cu interconnect with an ammonia-containing plasma to reduce any copper oxide thereon, after which the plasma conditions are discontinued. Silane is then introduced into the reaction chamber, a plasma is generated and the silicon nitride capping layer deposited. During such processing, the wafer containing the Cu interconnect is subjected to an elevated temperature, as about 300° C. to about 420° C., for an extending period of time, e.g., about 140 seconds or longer. It is believed that exposure of the Cu interconnect to such an elevated temperature for such a long period of time is a significant contributing cause of the formation of a large amount of hillocks and of large size hillocks.

Having uncovered what is believed to be a primary source of the problem of hillock generation during formation of a capped Cu interconnect, experimentation was undertaken to implement ways to reduce the cycle time or time during which a wafer containing a Cu interconnect is exposed to elevated temperatures during capping. In accordance with embodiments of the present invention, the time during which a wafer containing a Cu interconnect is exposed to elevated temperature, such as the time during which the wafer is in the reaction chamber for capping, is significantly reduced by maintaining a continuous plasma throughout the surface treatment and capping layer deposition.

Accordingly, embodiments of the present invention comprise introducing a wafer containing a Cu interconnect, subsequent to CMP, into a reaction chamber maintained at a temperature of about 300° C. to about 420° C. It was found particularly useful to purge the reaction chamber, as with nitrogen, prior to introducing the wafer. After introducing the wafer into the reaction chamber, ammonia and nitrogen are introduced and the pressure adjusted. Upon establishing the proper atmosphere, an RF power is applied to generate a plasma and effect treatment of the exposed surface of the Cu interconnect under plasma conditions in an atmosphere containing ammonia and nitrogen, during which treatment copper oxide is removed from the Cu surface. Silane is then introduced while maintaining essentially the same plasma conditions to effect deposition of a silicon nitride capping layer in an atmosphere comprising ammonia, nitrogen and silane. Subsequent to deposition of the silicon nitride capping layer, the plasma is discontinued and any remaining gases in the furnace, including any by-products, are removed, as by purging followed by pumping down or evacuating. It was found that the cycle time in the reaction chamber during which the wafer is exposed to an elevated temperature can be significantly reduced, as to below 60 seconds, e.g., not greater than about 52 seconds, by maintaining a continuous plasma throughout and between surface treatment and capping layer deposition.

Embodiments of the present invention include treating the surface of the Cu interconnect in a plasma containing ammonia and nitrogen for about 5 seconds to about 15 seconds to remove copper oxide, followed by deposition of a silicon nitride capping layer for a period of time of about 10 seconds to about 30 seconds under essentially the same plasma conditions but with silane present. In conducting surface treatment of the Cu interconnect under plasma conditions, it was found suitable to employ an ammonia flow rate of about 182 to about 338 sccm, a nitrogen flow rate of about 6,020 to 11,180 sccm, a pressure of about 3.36 Torr to about 6.24 Torr, a temperature of about 300° C. to about 420° C. and an RF power of about 140 to about 260 watts. These plasma conditions are maintained during silicon nitride capping layer deposition, except that silane is introduced at a flow rate of about 105 sccm to about 195 sccm. By maintaining a continuous plasma throughout surface treatment and capping layer deposition, the wafer can be processed without exposure to elevated temperatures for a period of time greater than about 60 seconds, e.g., not greater than about 52 seconds. The resulting capped Cu interconnect exhibits high integrity and significantly reduced hillock formation in terms of amount and size. Embodiments of the present invention, therefore, enable a significant increase in device reliability, particularly in the submicron regime.

Cu and/or Cu alloy interconnect members formed in accordance with embodiments of the present invention can be, but are not limited to, interconnects formed by damascene technology. Thus, embodiments of the present invention include forming an interlayer dielectric overlying a substrate, forming an opening, e.g., a damascene opening, in the interlayer dielectric, depositing a diffusion barrier layer, such as TaN, and filling the opening with Cu or a Cu alloy layer. Advantageously, the opening in the interlayer dielectric can be filled by initially depositing a seed layer and then electroplating or electrolessly plating the Cu or Cu alloy layer. CMP is then performed such that the upper surface of the Cu or Cu alloy layer is substantially coplanar with the upper surface of the interlayer dielectric. As a result of CMP, a thin film of copper oxide is typically formed. The exposed oxidized surface of the Cu or Cu alloy is then processed in accordance with one or more disclosed embodiments, thereby forming a reliably capped Cu interconnect with significantly reduced hillock formation.

In accordance with embodiments of the present invention, the damascene opening can also be filled with Cu or a Cu alloy by PVD at a temperature of about 50° C. to about 150° C. or by CVD at a temperature under about 200° C. In various embodiments of the present invention, conventional substrates and interdielectric layers, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron- and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques. Interlayer dielectrics in accordance with the present invention can also comprise low dielectric contact materials, including polymers, such as polyamides.

An embodiment of the present invention is schematically illustrated in FIGS. 1–4, wherein similar reference numerals denote similar features. Adverting to FIG. 1, damascene opening 11, such as a contact or via hole, is formed in dielectric layer 10, e.g., silicon dioxide. It should be understood that opening 11 can also be formed as a dual damascene opening comprising a contact or via hole section in communication with a trench section. A barrier layer 12 is deposited, such as TaN, Cu layer 13 is then deposited. Upon electroplating or electroless plating layer 13, a seed layer (not shown) is deposited on barrier layer 12.

Figure 2:
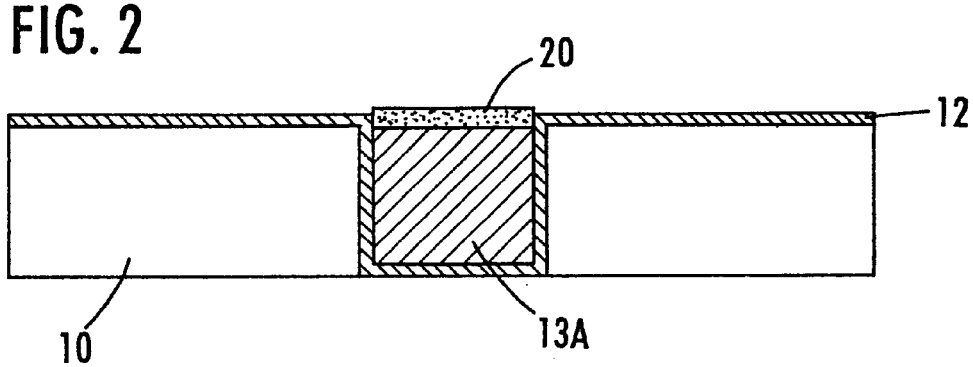

Adverting to FIG. 2, the portions of the Cu layer 13 extending beyond opening 11 are removed, as by CMP. As a result, a tin film of copper oxide 20 is formed on the exposed surface of the Cu interconnect member 13A. The wafer containing the Cu metallization is then introduced into a reaction chamber in accordance with the embodiments of the present invention. The reaction chamber is initially purged with nitrogen at a temperature of about 300° C. to about 420° C. to remove residual gasses from previous processing and condition the reaction chamber for plasma treatment and capping layer deposition.

Figure 3:
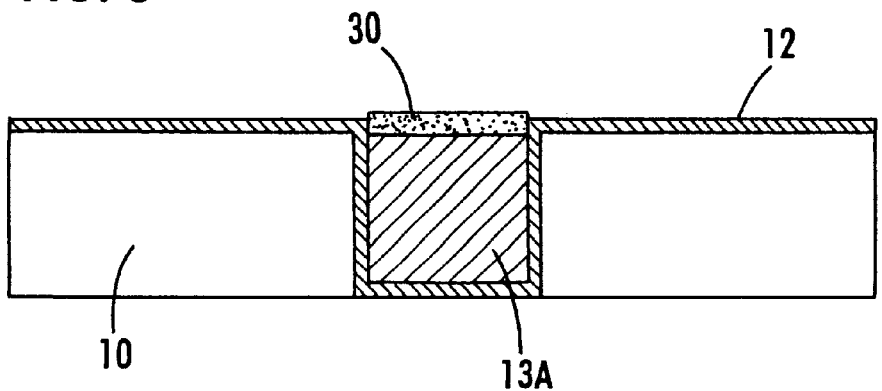
Figure 4:
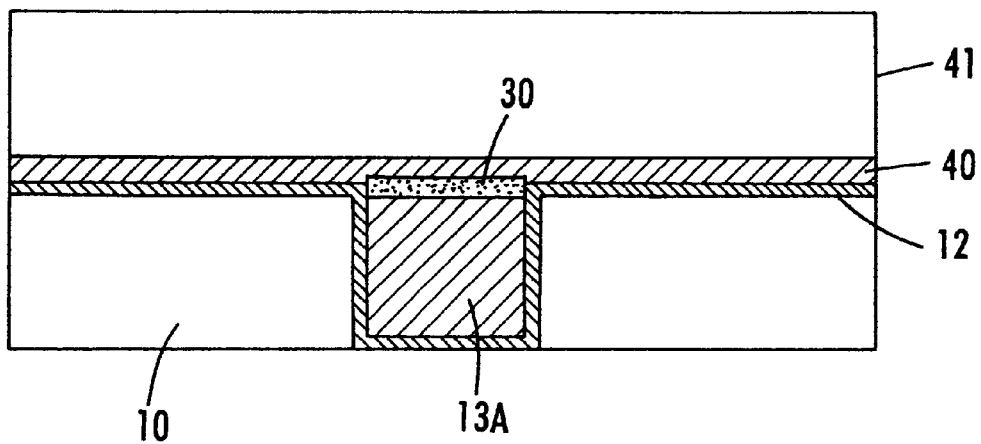

Adverting to FIG. 3, in accordance with embodiments of the present invention, ammonia and nitrogen are introduced and a plasma established to effect treatment of the exposed surface of the Cu interconnect member 13A to remove or substantially reduce the thin copper oxide film 20 leaving a clean reduced Cu surface 30. At this point, silane is introduced, while maintaining the plasma without interruption, to effect deposition of the silicon nitride capping layer 40, as shown in FIG. 4, completely encapsulating the Cu interconnect 13. Another interlayer dielectric 41 is then deposited, such as silicon dioxide derived from TEOS or silane. In this way, a plurality of interlayer dielectrics and metallization patterns are built up on a semiconductor substrate and various interconnect are formed. By maintaining plasma conditions continuous throughout surface treatment and capping layer deposition, the amount of time and the wafer is exposed to elevated temperatures, e.g., about 300° C. to about 420° C., can be minimized, such as no greater than about 60 seconds, e.g., no greater than about 52 seconds, thereby significantly reducing the amount and size of hillocks generated during capping.

The present invention enables the formation of reliably capped Cu interconnects with significantly reduced hillock formation, thereby reducing failures due to penetration of the capping layer and/or shorting between Cu lines. In addition, the capping layer is tightly adhered to the surface of the Cu interconnect with an attendant further increase in device reliability.

EXAMPLE

Run A

An embodiment of the present invention was implemented by introducing a wafer containing a Cu interconnect, after CMP, into a reaction chamber maintained at a temperature between 300° C. and 420° C. after purging the reaction chamber with nitrogen. Ammonia was introduced at a flow rate of 260 sccm and maintained at that flow rate. Nitrogen was introduced at a flow rate of 8,660 sccm and maintained at that flow rate. The pressure was adjusted to 4.8 Torr. About 10 seconds after the wafer was introduced into the reaction chamber an RF power of about 200 watts was applied thereby generating a plasma within the chamber and effecting treatment of the surface of the Cu interconnect to remove copper oxide. Such surface treatment was conducted for about 15 seconds. At this point, without interruption of the plasma, silane was introduced at a flow rate of about 150 sccm to effect deposition of a silicon nitride capping layer on the treated surface of the Cu interconnect for a period of about 12 seconds. After capping layer deposition, the plasma was discontinued and any remaining gasses, including by-product gases, were removed by purging for about 5 seconds and pumping down or evacuating for about 10 seconds. The wafer was then removed from the reaction chamber. The total time during which the wafer was in the reaction chamber exposed to an elevated temperature between 300° C. and 420° C. was 52 seconds.

Run B

As a comparison, in accordance with a prior technique, a wafer containing a Cu interconnect was subjected to CMP and then introduced in the same reaction chamber used in Run A maintained at the same temperature between 300° C. and 420° C. Ammonia was introduced at a flow rate of about 800 sccm and a pressure of 8 Torr established, which consumed about 15 seconds. An RF power of about 200 watts was then applied to generate a plasma and the surface of the Cu interconnect was treated for about 40 seconds to remove copper oxide. The plasma was discontinued and the reaction evacuated for a period of about 30 seconds. Subseqently, ammonia was introduced at a flow rate of about 260 sccm and nitrogen was introduced at a flow rate of about 8600 sccm for a period of about 5 seconds. Subseqently, silane was slowly introduced, as at a flow rate of about 60 sccm for about 5 seconds, a flow rate of about 100 sccm for another 5 seconds and a flow rate of about 150 sccm for another 5 seconds. A pressure of 4.8 Torr was established and a RF power of about 500 watts applied to effect deposition of a silicon nitride capping layer for about 12 seconds. After deposition, the plasma was discontinued and any remaining gases, including by-product gasses, were removed by purging for about 10 seconds followed by pumping down or evacuating for about 15 seconds. The total time consumed was 142 seconds.

Figure 5:
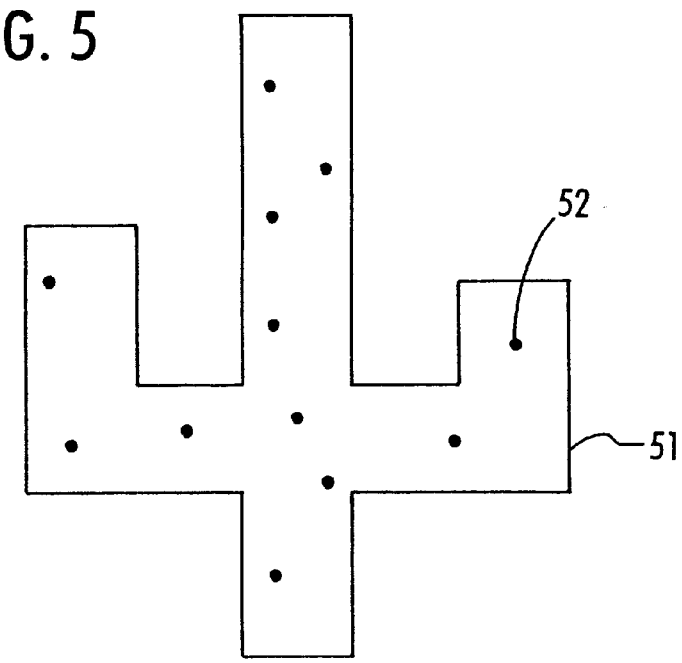
FIG. 5 schematically illustrates hillock formation attendant upon conventional practices.
Figure 6:
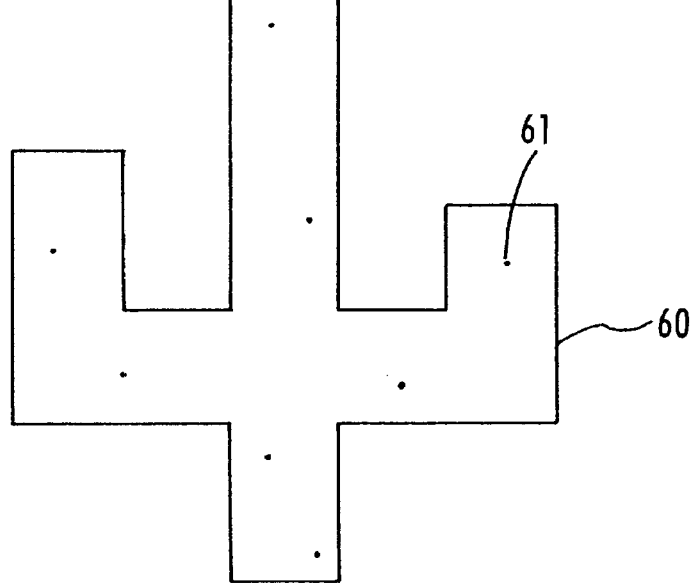
FIG. 6 schematically illustrates the advantageous reduction in hillock formation in accordance with an embodiment of the present invention.

The hillock formation attendant upon processing in Run B is schematically illustrated in FIG. 5 showing Cu interconnect 51 and hillocks 52 of a rather large size and large population. However, in accordance with the exemplified embodiment of the present invention (Run A), as illustrated in FIG. 6, Cu interconnect 60 exhibited fewer hillocks 61 and of a smaller size vis-à-vis Run B. Thus, embodiments of the present invention wherein the time during which a Cu interconnect is exposed to elevated temperatures to effect forming a capping layer is significantly reduced enables a significant reduction in the amount and size of hillocks, e.g., at least about 30% reduction in the amount and size of hillocks. Moreover, embodiments of the present invention enable a significant increase in throughput achieved in a cost effective efficient manner.

The present invention provides simplified, cost effective technology for increasing the reliability of capped Cu interconnects by significantly reducing the amount and size of hillocks generated during thermal processing and improving the integrity of the bond between the Cu interconnect and capping layer, thereby significantly increasing manufacturing throughput. Embodiments of the present invention comprise maintaining a continuous plasma throughout treatment of the Cu surface to remove copper oxide and deposition of the silicon nitride capping layer with no interruption of the plasma therebetween. By maintaining a continuous plasma, the cycle time can be significantly reduced during which the wafer is exposed to elevated temperatures, thereby reducing the amount and size of hillocks.

The present invention enjoys industrial applicability in the formation of various types of inlaid Cu metallization and interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising:

treating a surface of a copper (Cu) or Cu alloy in a reaction chamber with a plasma containing ammonia and nitrogen; and introducing silane into the reaction chamber while maintaining the plasma to deposit a silicon nitride barrier layer on the treated surface of the Cu or Cu alloy in the plasma containing ammonia, nitrogen and silane, with no interruption of the plasma between treating the exposed surface and depositing the silicon nitride barrier layer.

2. The method according to claim 1, wherein the chamber is maintained at an elevated temperature during treating the exposed surface and depositing the silicon nitride barrier layer.

3. The method according to claim 2, wherein the Cu or Cu alloy is not exposed to the elevated temperature in the reaction chamber for a period of time greater than about 60 seconds.

4. The method according to claim 3, wherein the Cu or Cu alloy is not exposed to the elevated temperature for a period of time greater than about 52 seconds.

5. The method according to claim 3, wherein the elevated temperature is about 300° C. to about 420° C.

6. The method according to claim 5, comprising:
treating the surface of the Cu or Cu alloy in the plasma containing ammonia and nitrogen for about 5 seconds to about 15 seconds; and
depositing the silicon nitride barrier layer on the treated surface for about 10 seconds to about 30 seconds.

7. The method according to claim 6, comprising:
treating the exposed surface of the Cu or Cu alloy in the plasma containing ammonia and nitrogen at:
an ammonia flow rate of about 182 to about 338 sccm;
a nitrogen flow rate of about 6,020 to about 11,180 sccm;
a pressure of about 3.36 to about 6.24 Torr; and
an RF power of about 140 to about 260 watts; and
depositing the silicon nitride capping layer in the plasma containing ammonia, nitrogen and silane at:
an ammonia flow rate of about 182 to about 338 sccm;
a nitrogen flow rate of about 6,020 to about 11,180 sccm;
a silane flow rate of about 105 to about 195 sccm;
a pressure of about 3.36 to about 6.24 Torr; and
an RF power of about 140 to about 260 watts.

8. A method of manufacturing a semiconductor device, the method comprising:
introducing a wafer into a reaction chamber maintained at an elevated temperature, the wafer containing an exposed surface of copper (Cu) or a Cu alloy;
treating the exposed surface of the Cu or Cu alloy in a plasma containing ammonia and nitrogen; and
introducing silane into the reaction chamber while maintaining the plasma to deposit a silicon nitride barrier layer on the treated Cu or Cu alloy surface with no interruption of the plasma between treating the exposed surface and depositing the silicon nitride barrier layer.

9. The method according to claim 8, wherein the wafer is exposed to the elevated temperature in the reaction chamber for no longer than 60 seconds.

10. The method according to claim 9, wherein the wafer is exposed to the elevated temperature in the reaction chamber for a period of time no longer than 52 seconds.

11. The method according to claim 9, wherein the elevated temperature is about 300° C. to about 420° C. and is maintained throughout treating the exposed surface and depositing the silicon nitride barrier layer.

12. The method according to claim 11, comprising:
treating the exposed surface of the Cu or Cu alloy in the plasma containing ammonia and nitrogen for about 5 seconds to about 15 seconds;
depositing the silicon nitride barrier layer on the treated Cu or Cu alloy surface for about 10 seconds to about 30 seconds.

13. The method according to claim 12, comprising:
treating the exposed surface of the Cu or Cu alloy in the plasma containing ammonia and nitrogen at:
an ammonia flow rate of about 182 to about 320 sccm;
a nitrogen flow rate of about 6,020 to about 11,180 sccm;
a pressure of about 3.36 to about 6.24 Torr; and
an RF power of about 140 to about 260 watts; and
depositing the silicon nitride barrier layer on the treated Cu or Cu alloy surface in the plasma containing silane, ammonia and nitrogen at:
an ammonia flow rate of about 182 to about 338 sccm;
a nitrogen flow rate of about 6,020 to about 11,180 sccm;
a silane flow rate of about 105 to about 195 sccm;
a pressure of about 3.36 to about 6.24 Torr; and
an RF power of about 140 to about 260 watts.

14. The method according to claim 11, comprising:
introducing ammonia and nitrogen into the reaction chamber after introducing the wafer therein;
initiating the plasma to treat the exposed surface of the Cu or Cu alloy in the plasma containing ammonia and nitrogen;
discontinuing the plasma after depositing the silicon nitride barrier layer;
removing any remaining gases from the reaction chamber; and
removing the wafer from the reaction chamber, wherein the wafer is in the reaction chamber for a period of time no longer than about 60 seconds.

15. The method according to claim 14, comprising:
treating the exposed surface of the Cu or Cu alloy in the plasma containing ammonia and nitrogen for about 5 second to about 15 seconds; and
depositing the silicon nitride barrier layer on the treated Cu or Cu alloy surface for about 10 seconds to about 30 seconds.

16. The method according to claim 15, comprising:
treating the exposed surface of the Cu or Cu alloy in the plasma containing ammonia and nitrogen at:
an ammonia flow rate of about 182 to about 320 sccm;
a nitrogen flow rate of about 6,020 to about 11,180 sccm;
a pressure of about 3.36 to about 6.24 Torr; and
an RF power of about 140 to about 260 watts; and
depositing the silicon nitride barrier layer on the treated Cu or Cu alloy surface in a plasma containing silane, ammonia and nitrogen at:
an ammonia flow rate of about 182 to about 338 sccm;
a nitrogen flow rate of about 6,020 to about 11,180 sccm;
a silane flow rate of about 105 to about 195 sccm;
a pressure of about 3.36 to about 6.24 Torr; and
an RF power of about 140 to about 260 watts.

17. The method according to claim 8, comprising:
conducting chemical mechanical polishing on the wafer prior to introducing the wafer into the reaction chamber.

* * * * *